United States Patent [19]

Howlett

[11] 4,177,457
[45] Dec. 4, 1979

[54] FLOATING POINT PLAYBACK SYSTEM
[75] Inventor: Donald L. Howlett, Houston, Tex.
[73] Assignee: Texaco Inc., White Plains, N.Y.
[21] Appl. No.: 859,491
[22] Filed: Dec. 12, 1977
[51] Int. Cl.² ............................................ H03K 13/02
[52] U.S. Cl. ............................................. 340/347 DA
[58] Field of Search ................... 340/347 DA, 347 M

[56] References Cited

U.S. PATENT DOCUMENTS

| 2,943,237 | 6/1960 | Bell ........................ 340/347 DA |
| 3,239,833 | 3/1966 | Gray ........................ 340/347 M |
| 3,579,232 | 5/1971 | Girard ...................... 340/347 DA |
| 3,685,046 | 8/1972 | Howlett ..................... 340/347 DA |
| 3,735,264 | 5/1973 | Mauduech ................... 340/347 DA |

OTHER PUBLICATIONS

Degryse "IEEE Transactions on Computers," vol. C-21, No. 11, Nov. 1972, pp. 1165–1168.

Primary Examiner—Charles D. Miller
Attorney, Agent, or Firm—Thomas H. Whaley; Carl G. Ries; Ronald G. Gillespie

[57] ABSTRACT

A system for playing back a wide dynamic amplitude range analog signal that is digitized in floating point word form. The word being represented in digital signal form by the general algebraic form $Q = \pm AB^{-N}$ where Q represents the amplitude of the analog signal, A represents the mantissa, B indicates the radix of the number system used, N represents the number of fixed gain amplifier steps, and is the exponent of B, each word is represented by a first plurality of binary bits representing N. The playback system includes a first converter receiving a reference voltage which converts the bits representing A to an interim analog signal. A second converter converts the bits representing N to a plurality of control signals. A resistor network is connected to ground and has N number of inputs and an output. The resistor network provides a signal which is a reduction of the interim analog signal applied to one of the inputs, the reduction being determined by which input the interim analog signal was applied to. Each switch of a plurality of switches is connected to the first and second converters, to ground and to a corresponding input of the resistor network. Each switch is responsive to the corresponding control signal either to apply the interim analog signal to the corresponding input of the resistor network when the control signal is at another logic level. An amplifier connected to the resistor network amplifies the output signal from the resistor network to provide an amplified signal corresponding to the wide dynamic amplitude range analog signal.

10 Claims, 1 Drawing Figure

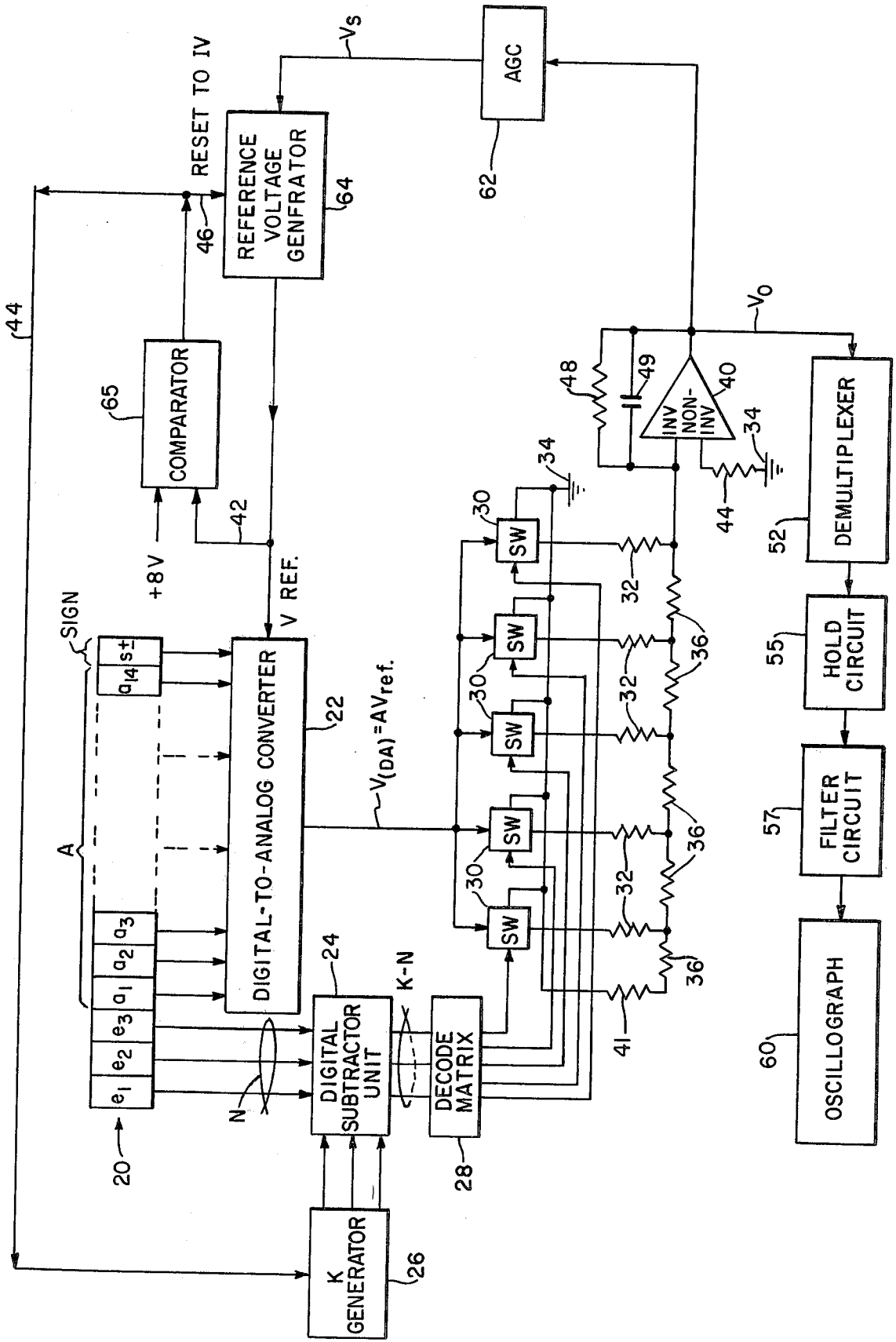

FLOATING POINT PLAYBACK SYSTEM

BACKGROUND OF THE INVENTION

1. Field of the Invention

The present invention relates to playback systems in general and, more particularly, seismic playback system.

2. Summary of the Invention

A playback system includes a first converter receiving a reference voltage which convert one group of digital signals to an interim analog signal corresponding to a mantissa A of a digital word in the general algebraic form $$Q = \pm AB^{-N}$$

where Q represents the amplitude of a wide dynamic amplitude range analog signal, B indicates the radix of the number system used and (N) represents exponent of Base. A second converter converts another group of digital signals corresponding to (N) to control signals. A resistor network is connected to ground and has N number of inputs and an output. The resistor network provides a signal which is a reduction of a signal applied to one of the inputs, the reduction being determined by which input the signal was applied to. Each switch of a plurality of switches is connected to the first and second converters, to ground and to a corresponding input of the resistor network. Each switch is responsive to a corresponding control signal to either apply the analog signal to the corresponding input of the resistor network when the control signal is at one logic level or connects the corresponding input of the resistor network to ground when the control signal is at another logic level. An amplifier connected to the resistor network amplifies the output signal from the resistor network to provide an amplified signal corresponding to the wide dynamic amplitude range analog signal.

The objects and advantages of the invention will appear more fully hereinafter from a consideration of the detailed description which follows, taken together with the following drawing wherein one embodiment of the invention is illustrated by way of example. It is to be expressly understood, however, that the drawing is for illustration purposes only and is not to be construed as defining the limits of the invention.

DESCRIPTION OF THE DRAWING

The drawing shows a playback system, constructed in accordance with the present invention, for providing at least one analog signal from stored digital signals. The playback system is shown in partial block diagram form and partial schematic form.

DESCRIPTION OF THE INVENTION

In U.S. Pat. No. 3,603,972 (Vanderford) which issued on Sept. 7, 1971 and is assigned to Texaco Inc. assignee of the present invention, there is disclosed a system wherein portions of an analog signal are converted to digital words where each digital word occupies a number of binary bit positions. Moreover, each such digital word is recorded in floating point form, or notation. Advantageously, the floating point form allows greater flexibility of operation and easier handling of numbers differing greatly from each other in magnitude. See, for example, the textbook "Digital Computer Primer" by E. M. McCormick, 1959, published by McGraw-Hill Book Co., Inc., beginning at page 152. In the system disclosed in the Vanderford patent application a floating point digital number, or word, in the foam of a mantissa and an exponent is recorded on magnetic tape. The floating point digital number, or word, represents the instantaneous absolute seismic voltage amplitude as it enters the floating point amplifier system disclosed by Vanderford, said voltage amplitude being the voltage amplitude delivered by a geophone to the amplifier system of Vanderford. The dynamic range of the floating point digital number, or word, may be in excess of 200 db, if necessary, to cover the dynamic amplitude range of input signals (equivalent to a 36 binary bit digital number, or word).

A specific example of the floating point digital word as set forth in conventional algebraic form is as follows:

$$V_{in} = \pm A8^{-N}$$

where $V_{in}$ represents the instantaneous absolute seismic voltage amplitude generated by the geophone, which voltage enters the floating point amplifier system of aforementioned Vanderford patent, A represents the mantissa, or argument, portion of the digital word; 8 represents the radix, or base of the number system used.

In order to record the floating point digital word of the equation in a binary register or on magnetic tape with, for example, 144 db of dynamic range and 14 bit accuracy 18 bit positions would be required where the mantissa A is represented in binary form and where the exponent (N) is also represented in binary form. Of the 18 bits required: 1 bit represents the sign ($\pm$) allowing for bipolar input-output capabilities; 14 bits represent the mantissa A; and, 3 bits represent the exponent N.

As shown in the FIGURE there is provided a register 20 which stores eighteen binary digits, or bits, which represent in digital form the amplitude of a seismic signal generated by a geophone. Of these eighteen bits three bits, identified at bit locations $e_1$, $e_2$ and $e_3$, in the register 20, as shown, represent the exponent E of a floating point digital word. In register 20 the fourteen bits identified at bit locations $a_1$ through $a_{14}$ represent the mantissa A and one bit identified at bit location $S\pm$ represents the sign, or polarity, of the seismic signal.

The above-mentioned eighteen bits may be assumed to have been initially recorded in a suitable storage means in the amplifier system disclosed in the aforemention Vanderford patent and subsequently transferred to the register 20. Register 20 may be included in the amplifier system of Vanderford or for present playback purposes may be considered to be an auxiliary register. Also, as indicated hereinbefore, since each amplifier stage in Vanderford's amplifier system has a constant gain of eight (8) then only the bits representing the exponent (N) and the mantissa A need to be recorded and ultimately delivered to the register 20.

The one bit representing the sign and the fourteen bits representing the mantissa are subsequently transferred to a digital-to-analog (D-A) converter 22 as shown the FIGURE. Another input to the D-A converter 22 is a variable reference voltage identified as $V_{ref}$. The source and character of $V_{ref}$ is discussed hereinafter in more detail, including pertinent mathematical relationships.

As shown the three bits representative of the exponent (N) are transferred from register 20 to a digital subtractor unit 24. Also, three additional bits representing an integer K are delivered to the digital subtractor unit 24 by a K generator, or counter, 26. In the specific embodiment shown in the drawing, let it be assumed that exponent (N) may be any of the decimal values 1, 2, 3, 4 or 5, and, hence, in binary form the bits $e_1$, $e_2$, $e_3$ would range from 001 to 101. K, which is also represented by three bits, is also an integer. Details respecting the K generator, or counter, 26 are discussed in more detail hereinafter. K may have any one of the decimal values 0, 1, 2, 3 or 4 (binary digits, or bits, ranging from 000 to 100).

As is indicated in the drawing the subtractor unit 24 delivers an output consisting of digital signals representative of three bits which, in turn, represent the integer [K−N]. These binary digits or bits representing [K−N] are subsequently delivered to a decode matrix unit designated generally by the reference number 28. Decode matrix 28 functions to convert the binary form signals, or bits, received from the bit positions $e_1$, $e_2$ and $e_3$ of register 20 to provide control signals. Analog signal $V_{D-A}$ is applied to N number of electronic switches 30 in this example five switches 30. Each switch 30 is a single-pole double-throw electronic switch being controlled by a corresponding control signal.

Each switch 30 is also connected to a corresponding resistor 32 and to ground 34. When a control signal is at a high logic level, a corresponding switch 30 is controlled to apply to signal $V_{D-A}$ to its corresponding resistor 32. When the control signal is at a low logic level, switch 30 is controlled to connect its corresponding resistor 32 to ground 34. Resistors 32 along with resistors 36 comprise a ladder network connected to an inverting input of an amplifier 40 as shown in the FIGURE. One end of the ladder network has a resistor 40 connected between a resistor 36 and ground 34.

In recording the wide dynamic range signal in digital word form in the floating point amplifier disclosed in Vanderford's patent application, hereinbefore identified, the relationship between the mantissa A and exponent E is:

$$A = V_{in} 8^{-N}, \qquad 2.$$

wherein A represents the mantissa; (N) represents the exponent, decimal number 8 is the gain of each amplifier stage in the Vanderford's system and is also the radix of the number system used; and $V_{in}$ represents the amplitude of the input voltage signal delivered by a geophone to Vanderford's system.

The D-A converter 22 converts the bits $a_1 \ldots a_{14}$ representing the mantissa A to an analog signal voltage $V_{(D-A)}$. However, this signal voltage is meaningless unless it is "defloated"; i.e., multiplied by the appropriate power of 8.

The "defloating" operation of the playback unit is such that only one switch of switches 30 provides signal $V_{D-A}$ to a resistor 32 while the other switches 30 connect the corresponding resistors 32 to ground 34. The operation as described performs the following mathematical relationship $$V_O = GV_{D-A} = -(8^{-(N-1)})(V_{O-A}), \qquad 3.$$

If scaling is required, the above equation may be rewritten as:

$$V_O = -(R_{48}/R_{32})(8^{-(N-1)})(V_{D-A}), \qquad 4.$$

The relationship of the resistors 20, 24 and 30 are such that the resistance value of a resistor 36 is seven times greater than the resistant value of resistor 41. The resistance value of a resistor 32 is 8/7 times greater than the resistance value of resistor 41. The resistance value of resistor 44 is equal to the parallel resistance of resistors $R_{32}$ and $R_{48}$ and the series combination of $R_{36}$ and $R_{41}$.

The non-inverting input of amplifier 40 is connected to ground 34 through a resistor 44. A feedback network connects the inverting input of amplifier 40 with its output. The feedback network includes a resistor 48 and a capacitor 49. Amplifier 40 provides a signal $V_0$ to a demultiplexer means 52. From demultiplexer 52, the signal is delivered to a hold circuit 55 and then to a filter circuit 57 from whence said signal may be delivered to a galvanometer-type oscillograph 60 which makes visible oscillograms, or wiggle traces, of compressed dynamic amplitude.

In practice, many geophones are used in the recording process. Therefore multi-channel playbacks are needed. To increase the number of playback channels, it is necessary to repeat only blocks 55, 57, 60 in the drawing. The remainder of the drawing is common to all channels.

In order to provide the variable reference voltage $V_{ref}$ and also to change the value of K delivered at the output of the K generator 26 there is included in the system of the drawing an AGC circuit 62, a reference voltage generator 64 and a comparator 65. AGC circuit 62 receives signal $V_0$ and provides a corresponding signal $V_S$ to reference voltage generator 64. As indicated a positive source of +8 volts is included for the purpose of providing a reference voltage for comparator 65. In addition, the reference voltage $V_{ref}$ is fed as another input to comparator 65. The output signal from comparator 65 is fed to the K generator 26 in order to change the value of K delivered to subtractor unit 24 by the K generator 26.

The output signal from comparator 65 is also to reference voltage generator 64. This signal to generator 64 serves the purpose of resetting the $V_{ref}$ output voltage to a lower value (+1 volt). The resetting of $V_{ref}$ in this respect will be discussed in more detail hereinafter.

In accordance with one specific illustrative, but not limiting, embodiment of the invention $V_{ref}$ is varying with respect to time between +1 volt and +8 volts as a function of the integral of signal $V_S$.

The comparator 65 senses the level of $V_{ref}$ and compares it with its +8 volts reference input. Each time $V_{ref}$ reaches +8 volts comparator 40 delivers an output pulse which does two things: resets $V_{ref}$ to +1 volt and courses the K generator 26, or counter, to increase K by +1.

The resistance value of the feedback resistor 48 is the same as resistor 32 resistance value.

The invention as hereinbefore described is for a playback unit for converting wide dynamic amplitude range digital data recorded in floating point digital word form to an analog signal for display on an oscillogram.

What is claimed is:

1. In a system wherein a wide dynamic amplitude range analog signal is digitized in floating point word form, said word being represented in digital signal form by the general algebraic form $Q = \pm AB^{-N}$ wherein Q represents the amplitude of the analog signal, A represents the mantissa, B indicates the radix of the number system used, N is the exponent, and wherein said word is represented by a first plurality of binary bits representing ±A and a second plurality of binary bits representing N, a system for recreating an analog signal from the floating point words comprising: first means for converting said bits representing A to an interim analog signal; second means for converting said bits representing N to a plurality of control signals; resistor network means for providing a signal which is a reduction of a signal applied to the resistor network means, said resistor network means including a first plurality of N number of resistor, having a first resistor and an Nth resistor, and all resistors in the first plurality of resistors have the same resistance value; a second plurality of N number of serially connected resistors having a first resistor and an Nth resistor, all resistors of the second plurality of resistors have the same resistance value, and connected so that each connection of two resistors of the second plurality of resistors is connected to one end of a corresponding resistor in the first plurality of resistors, and a first resistor connecting the Nth resistor of the second plurality of resistors to ground, where the first resistor has a resistance value that is one-seventh of the value of the resistance value of a resistor in the second plurality of resistors and a resistance value that is seven-eighths of the resistance value of a resistor in the first plurality of resistors; a plurality of switching means, each switching means being connected to the first and second converting means, to ground and to the unconnected end of a corresponding resistor of the first plurality of resistors for applying the interim analog signal to the corresponding resistor of the first plurality of resistors when a corresponding control signal is at one logic level and for connecting the corresponding resistor of the first plurality of resistor network means to ground when the corresponding control signal is at another logic level; and amplifier means connected to the unconnected end of the first resistor of the second plurality of resistors for amplifying the signal provided by the resistor network means to provide an amplified signal corresponding to the wide dynamic amplitude range analog signal.

2. A system as described in claim 1 which the amplifier means includes an amplifier having as inverting input connected to the first resistors of the first and second pluralities of resistors, a non-inverting input and an output; a feedback network including a feedback resistor connecting the inverting input of the amplifier to the output of the amplifier, and a feedback capacitor connected in parallel with the feedback resistor; and a second resistor connecting the non-inverting input of the amplifier to ground.

3. A system as described in claim 2 in which the first converter means includes means for providing a sawtooth reference voltage, and a digital-to-analog converter receiving the bits corresponding to the mantissa A and the sawtooth reference voltage and having an output connected to all the switching means and which converts the bits to the interim analog signal in accordance with the sawtooth reference voltage.

4. A system as described in claim 3 in which the second converter means includes pulse means connected to the reference voltage means for providing a pulse each time a peak of the sawtooth reference voltage occurs, K signal means connected to the pulse means for counting the pulses and providing K digital signals in accordance with the count, subtracting means connected to the K signal means and receiving the digital bits corresponding to (N) for subtracting the digital bits from the K signals to provide digital signals corresponding to $K-(N)$ and decoding means connected to subtracting means and to all the switching means for decoding the digital signals from the subtracting means to provide the control signals to the switching means.

5. A system as described in claim 4 in which the resistance values of the resistors are selected in accordance with the radix B of the number system used.

6. A system as described in claim 5 in which the ratio of the resistance of the feedback resistor to the resistance value of a resistor in the first plurality of resistors determines a scaling factor.

7. A system as described in claim 6 in which the resistance value of the second resistor is equal to the ratio of the product of the resistance values of the first resistor and the feedback resistor to the sum of the resistance values of the first resistor and the feedback resistor.

8. A system as described in claim 1 further comprising recording means connected to the output of the amplifier for recording the amplified signal.

9. A system as described in claim 8 in which a plurality of wide dynamic amplitude range analog signals are represented by multiplexed floating point digital words; and further comprising means for demultiplexing the amplified signal to a plurality of analog signals corresponding on one for one basis to the wide dynamic amplitude range analog signals.

10. A system as described in claim 9 in further comprising filter means connecting the output of the demultiplexer to the recording means for smoothing the amplified signal prior to recording.

* * * * *